(12) United States Patent
Joo et al.

(10) Patent No.: US 9,735,379 B2
(45) Date of Patent: Aug. 15, 2017

(54) DISPLAY APPARATUS, APPARATUS AND METHOD OF MANUFACTURING DISPLAY APPARATUS

(71) Applicant: SAMSUNG DISPLAY CO., LTD., Yongin, Gyeonggi-Do (KR)

(72) Inventors: Hyunwoo Joo, Yongin (KR); Sungwoo Ryu, Yongin (KR); Jaewon Shim, Yongin (KR); Whanchae Yong, Yongin (KR); Sukwon Jung, Yongin (KR); Myungsoo Huh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 15 days.

(21) Appl. No.: 14/730,126

(22) Filed: Jun. 3, 2015

(65) Prior Publication Data

US 2016/0204364 A1    Jul. 14, 2016

(30) Foreign Application Priority Data

Jan. 14, 2015    (KR) .......................... 10-2015-0006975

(51) Int. Cl.

| | | |
|---|---|---|
| *H01L 51/00* | (2006.01) | |
| *C23C 4/134* | (2016.01) | |
| *B05B 7/00* | (2006.01) | |
| *B05D 1/02* | (2006.01) | |
| *H01L 27/32* | (2006.01) | |
| *H01L 51/52* | (2006.01) | |

(Continued)

(52) U.S. Cl.

CPC ............ *H01L 51/0096* (2013.01); *B05B 7/00* (2013.01); *B05D 1/02* (2013.01); *C23C 4/134* (2016.01); *C25D 5/08* (2013.01); *H01L 27/3244* (2013.01); *H01L 51/003* (2013.01); *H01L 51/5237* (2013.01); *H01L 51/56* (2013.01); *H01L 2227/323* (2013.01); *H01L 2227/326* (2013.01)

(58) Field of Classification Search
CPC .................................................. H01L 51/5237
See application file for complete search history.

(56) References Cited

U.S. PATENT DOCUMENTS

| | | | | |
|---|---|---|---|---|
| 5,568,821 A | * | 10/1996 | Ohmori ..................... | B08B 3/04 134/61 |
| 6,634,370 B2 | * | 10/2003 | Nakashima ....... | H01L 21/67167 118/500 |

(Continued)

FOREIGN PATENT DOCUMENTS

| | | |
|---|---|---|
| KR | 10-2008-0004232 A | 1/2008 |
| KR | 10-2008-0104324 A | 12/2008 |

(Continued)

*Primary Examiner* — Tuan Nguyen
(74) *Attorney, Agent, or Firm* — Lewis Roca Rothgerber Christie LLP

(57) ABSTRACT

Provided are a display apparatus and an apparatus and method of manufacturing the display apparatus. The apparatus for manufacturing a display apparatus includes: a dry cleansing unit configured to remove impurities from a surface of a mother substrate; an electrolyte treatment unit connected to the dry cleansing unit and configured to treat the surface of the mother substrate with electrolytes; and an exfoliated layer forming unit connected to the electrolyte treatment unit and configured to form an exfoliated layer on the mother substrate.

19 Claims, 4 Drawing Sheets

(51) Int. Cl.
*H01L 51/56* (2006.01)
*C25D 5/08* (2006.01)

(56) References Cited

U.S. PATENT DOCUMENTS

| | | | |
|---|---|---|---|
| 6,817,387 B2* | 11/2004 | Park | B08B 3/02 |
| | | | 141/65 |
| 7,141,348 B2 | 11/2006 | Sheats et al. | |
| 2004/0259326 A1* | 12/2004 | Hideo | G02F 1/136277 |
| | | | 438/458 |
| 2005/0018098 A1* | 1/2005 | Sugihara | G02F 1/1362 |
| | | | 349/49 |
| 2007/0009827 A1 | 1/2007 | Sheats et al. | |
| 2007/0222370 A1 | 9/2007 | Zhu et al. | |
| 2012/0118478 A1 | 5/2012 | Park et al. | |
| 2012/0313508 A1* | 12/2012 | Son | H01L 51/56 |
| | | | 313/504 |
| 2013/0062591 A1* | 3/2013 | Jun | H01L 33/505 |
| | | | 257/9 |
| 2013/0105203 A1 | 5/2013 | Lee et al. | |
| 2014/0126135 A1* | 5/2014 | Abbatiello | B29C 70/68 |
| | | | 361/679.31 |
| 2015/0259786 A1* | 9/2015 | Ko | H01L 51/5253 |
| | | | 118/50.1 |

FOREIGN PATENT DOCUMENTS

| | | |
|---|---|---|
| KR | 10-2012-0006844 A | 1/2012 |
| KR | 10-2012-0050581 A | 5/2012 |
| KR | 10-1206352 B1 | 11/2012 |

\* cited by examiner

DISPLAY APPARATUS, APPARATUS AND METHOD OF MANUFACTURING DISPLAY APPARATUS

CROSS-REFERENCE TO RELATED APPLICATION

This application claims priority to and the benefit of Korean Patent Application No. 10-2015-0006975, filed on Jan. 14, 2015 in the Korean Intellectual Property Office, the disclosure of which is incorporated herein in its entirety by reference.

BACKGROUND

1. Field

One or more exemplary embodiments of the present invention relate to a display apparatus and an apparatus and method of manufacturing the display apparatus.

2. Description of the Related Art

Portable electronic devices are being widely used. Examples of portable electronic devices that are being widely used include small electronic devices, such as mobile phones and tablet PCs.

Such electronic devices include displays in order to support various functions and provide a user with visual information, such as images and/or video. Furthermore, displays which are bent at an angle are also becoming popular. Recently, as components for operating the displays decrease in size, the displays tend to occupy an increasingly greater amount of the electronic devices.

SUMMARY

One or more exemplary embodiments of the present invention include a display apparatus and an apparatus and method of manufacturing the display apparatus.

Additional aspects of embodiments of the present invention will be set forth in part in the description which follows and, in part, will be apparent from the description or may be learned by practice of the presented embodiments.

According to one or more exemplary embodiments of the present invention, an apparatus for manufacturing a display apparatus includes: a dry cleansing unit configured to remove impurities from a surface of a mother substrate; an electrolyte treatment unit connected to the dry cleansing unit and configured to treat the surface of the mother substrate with electrolytes; and an exfoliated layer forming unit connected to the electrolyte treatment unit and configured to form an exfoliated layer on the mother substrate.

The dry cleansing unit may be configured to spray oxygen plasma onto the mother substrate.

The electrolyte treatment unit may include: an electrolyte treatment fluid coating unit configured to coat the mother substrate with an electrolyte treatment fluid; and a first rinsing unit configured to spray the mother substrate with nonpolar water to rinse the mother substrate.

The electrolyte treatment unit may further include a first air knife unit configured to evaporate the electrolyte treatment fluid on the mother substrate and to remove a portion of the electrolyte treatment fluid.

The electrolyte treatment fluid may contain poly diallyldimethylammonium chloride (PDDA).

The exfoliated layer forming unit may include: an exfoliated layer spreading unit configured to spread the exfoliated layer onto the mother substrate treated with the electrolyte treatment fluid; and a second rinsing unit configured to spray the exfoliated layer with nonpolar water to rinse the exfoliated layer.

The exfoliated layer forming unit may further include a second air knife unit configured to remove moisture from the exfoliated layer and to remove a portion of the exfoliated layer.

The exfoliated layer may contain at least one of a graphene oxide and montmorillonite (MMT).

The exfoliated layer may be formed on at least a portion of the mother substrate.

According to one or more exemplary embodiments of the present invention, a method of manufacturing a display apparatus includes: treating a surface of a mother substrate with an electrolyte treatment fluid; forming an exfoliated layer on the mother substrate treated with the electrolyte treatment fluid; and forming a substrate on the surface of the mother substrate by forming a plurality of polyimide layers spaced from one another on the exfoliated layer.

The method may further include removing impurities from the surface of the mother substrate.

The removing of the impurities from the surface of the mother substrate may include spraying oxygen plasma onto the surface of the mother substrate.

The treating of the surface of the mother substrate may include: treating the surface of the mother substrate with the electrolyte treatment fluid; and spraying the electrolyte treatment fluid with nonpolar water to rinse the mother substrate.

The treating of the surface of the mother substrate may further include drying the electrolyte treatment fluid by spraying the electrolyte treatment fluid with air and removing a portion of the electrolyte treatment fluid.

The electrolyte treatment fluid may contain poly diallyldimethylammonium chloride (PDDA).

The forming of the exfoliated layer may include: spreading the exfoliated layer across the mother substrate; and spraying the exfoliated layer with nonpolar water and to rinse the exfoliated layer.

The forming of the exfoliated layer may include: drying the exfoliated layer by spraying the exfoliated layer with air; and removing a portion of the exfoliated layer.

The exfoliated layer may contain at least one of a graphene oxide and montmorillonite (MMT).

The method may further include: forming a display on each of the mother substrate and the substrate; and separating the mother substrate from the substrate.

According to one or more exemplary embodiments of the present invention, a display apparatus includes: a substrate including an exfoliated layer at a lower portion thereof; a display formed on the substrate and including a thin film transistor (TFT) and an organic light-emitting device; and a thin film encapsulation layer covering the display.

These exemplary embodiments of the inventive concept may be implemented by using a system, a method, a computer program, or a combination thereof.

BRIEF DESCRIPTION OF THE DRAWINGS

These and/or other aspects of the present invention will become apparent and more readily appreciated from the following description of exemplary embodiments, taken in conjunction with the accompanying drawings in which.

DETAILED DESCRIPTION

Figure 1:
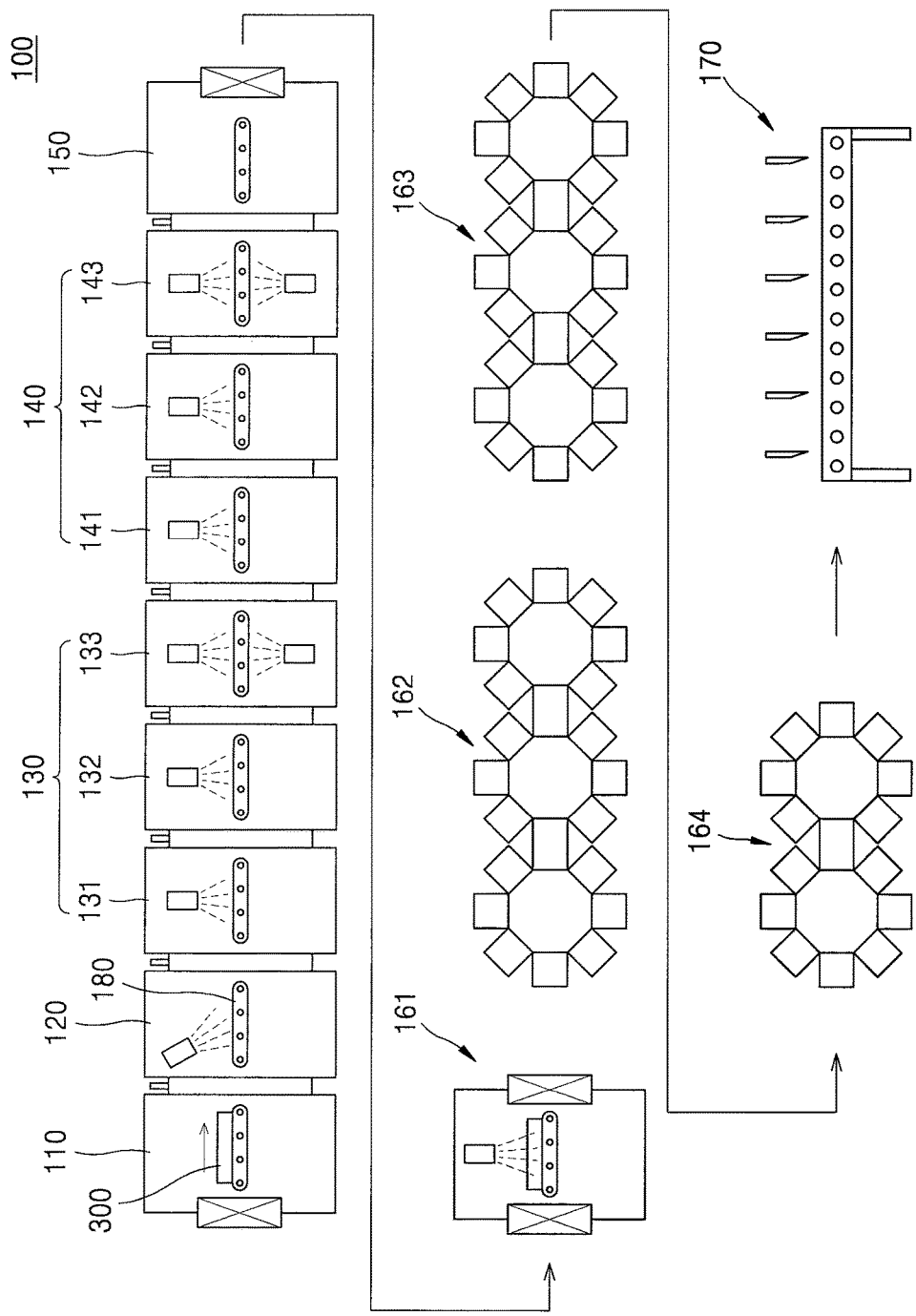
FIG. 1 is a conceptual view of an apparatus for manufacturing a display apparatus according to an exemplary embodiment.

The inventive concept will now be described more fully with reference to the accompanying drawings, in which exemplary embodiments of the inventive concept are shown. The attached drawings, which illustrate exemplary embodiments of the inventive concept, are referred to in order to gain a sufficient understanding of the inventive concept, the merits thereof, and the features and aspects of the inventive concept. The inventive concept may, however, be embodied in many different forms and should not be construed as being limited to the embodiments set forth herein. Hereinafter, the inventive concept will be described in detail by explaining exemplary embodiments of the inventive concept with reference to the attached drawings. Like reference numerals in the drawings denote like elements, and descriptions thereof may be omitted.

It will be understood that when an element or layer is referred to as being "on", "connected to", or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. The same reference numerals designate the same elements. While such terms as "first", "second", etc., may be used to describe various components, such components must not be limited to the above terms. The above terms are used only to distinguish one component from another.

An expression used in the singular encompasses the expression of the plural, unless it has a clearly different meaning in the context.

In the present specification, it is to be understood that the terms such as "including", "having", and "comprising" are intended to indicate the existence of the features, numbers, steps, actions, components, parts, or combinations thereof disclosed in the specification but are not intended to preclude the possibility that one or more other features, numbers, steps, actions, components, parts, or combinations thereof may exist or may be added. As used herein, the term "and/or" includes any and all combinations of one or more of the associated listed items. Further, the use of "may" when describing embodiments of the present invention relates to "one or more embodiments of the present invention". Expressions, such as "at least one of," when preceding a list of elements, modify the entire list of elements and do not modify the individual elements of the list. Also, the term "exemplary" is intended to refer to an example or illustration.

It will be understood that when a component, such as a layer, a film, a region, or a plate, is referred to as being "on" another component, the component can be directly on the other component or intervening components may be present thereon.

Sizes of components in the drawings may be exaggerated for convenience of explanation. In other words, because sizes and thicknesses of components in the drawings may be arbitrarily illustrated for convenience of explanation, the following embodiments are not limited thereto. Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

When a certain embodiment may be implemented differently, a specific process order may be performed differently from the described order. For example, two consecutively described processes may be performed at substantially the same time or performed in an order opposite to the described order.

FIG. 1 is a conceptual view of an apparatus 100 for manufacturing a display apparatus according to an exemplary embodiment of the present invention.

Referring to FIG. 1, the apparatus 100 for manufacturing a display apparatus may include a loading unit 110, a dry cleansing unit 120, an electrolyte treatment unit 130, an exfoliated layer forming unit 140, and an unloading unit 150. In one embodiment, each unit may be connected to each other by a separate transfer chamber, a connection chamber, and/or the like. Also, the apparatus 100 for manufacturing a display apparatus may further include a substrate forming unit 161, a transistor forming unit 162, an organic light-emitting device forming unit 163, an encapsulation layer forming unit 164, and/or a cutting unit 170. The substrate forming unit 161, the transistor forming unit 162, the organic light-emitting device forming unit 163, the encapsulation layer forming unit 164, and the cutting unit 170 may be sequentially connected to the exfoliated layer forming unit 140. According to another embodiment, the substrate forming unit 161, the transistor forming unit 162, the organic light-emitting device forming unit 163, the encapsulation layer forming unit 164, and the cutting unit 170 may be sequentially connected to the unloading unit 150. As another example, the substrate forming unit 161, the transistor forming unit 162, the organic light-emitting device forming unit 163, the encapsulation layer forming unit 164, and the cutting unit 170 are separately installed in the apparatus 100 for manufacturing a display apparatus, and a mother substrate 300 may be sequentially provided to each of the substrate forming unit 161, the transistor forming unit 162, the organic light-emitting device forming unit 163, the encapsulation layer forming unit 164, and the cutting unit 170.

Other units (e.g., other than the aforementioned units) may be installed in the apparatus 100 for manufacturing a display apparatus. In one or more embodiments, the apparatus 100 for manufacturing a display apparatus may include all devices and structures used for manufacturing a flexible display device. Hereinafter, for convenience of explanation, an embodiment in which the loading unit 110, the dry cleansing unit 120, the electrolyte treatment unit 130, the exfoliated layer forming unit 140, and the unloading unit 150 are arranged along a line (e.g., are in a linear arrangement) and the substrate forming unit 161, the transistor forming unit 162, the organic light-emitting device forming unit 163, the encapsulation layer forming unit 164, and the cutting unit 170 are separately arranged in the apparatus 100 for manufacturing a display apparatus will be described in further detail.

The loading unit 110 receives the mother substrate 300 from the outside (e.g., from outside the loading unit 110 or from the outside of the apparatus 100) and may provide the received mother substrate 300 to the dry cleansing unit 120. In one embodiment, a conveyor 180, a robot arm, etc. are installed in the loading unit 110 to transport the mother substrate 300. Hereinafter, for convenience of explanation, an embodiment in which the mother substrate 300 is transported by the conveyor 180 will be described in further detail.

The dry cleansing unit 120 may use air to cleanse a surface of the mother substrate 300. For example, the dry cleansing unit 120 may remove impurities from the surface of the mother substrate 300 by spraying the mother substrate 300 with oxygen plasma. In one embodiment, the oxygen plasma may negatively charge the surface of the mother substrate 300. Also, the conveyor 180 is installed to pass through the dry cleansing unit 120 and may transport the mother substrate 300.

The mother substrate 300 that is dry-cleansed may be transported to the electrolyte treatment unit 130. In one embodiment, the electrolyte treatment unit 130 may include an electrolyte treatment fluid coating unit 131, a first rinsing unit 132, and a first air knife unit 133.

The electrolyte treatment fluid coating unit 131 may coat an upper surface (e.g., the surface) of the mother substrate 300 with an electrolyte treatment fluid. In one embodiment, the electrolyte treatment fluid may contain polydiallyldimethylammonium chloride (PDDA). Also, the electrolyte treatment fluid coating unit 131 coats the upper surface of the mother substrate 300 with the electrolyte treatment fluid in a liquid or spray form in order to treat the surface of the mother substrate 300 with the electrolyte treatment fluid. For example, the electrolyte treatment fluid may be an aqueous solution diluted with water.

The first rinsing unit 132 may spray nonpolar water onto the deposited electrolyte treatment fluid. In one embodiment, the nonpolar water may be generated through electrolysis, and for example, the nonpolar water may be ultrapure water.

The first air knife unit 133 may spray the electrolyte treatment fluid with air. In one embodiment, the air may contain nitrogen ($N_2$). For example, the first air knife unit 133 may evaporate the electrolyte treatment fluid. Also, the first air knife unit 133 may prevent the electrolyte treatment fluid from agglomerating in a certain area. For example, when the first air knife unit 133 sprays air, a portion of the electrolyte treatment fluid may be removed, and the electrolyte treatment fluid that has agglomerated in a certain area may be evenly spread across the mother substrate 300.

The above-described operation of spraying the electrolyte treatment fluid and spraying the electrolyte treatment fluid with the air may be performed by installing the conveyor 180 to pass through the electrolyte treatment fluid coating unit 131, the first rinsing unit 132, and the first air knife unit 133 and transporting the mother substrate 300. In one embodiment, the electrolyte treatment fluid coating unit 131, the first rinsing unit 132, and the first air knife unit 133 may be connected to each other along a line.

After treating the mother substrate 300 with the electrolyte treatment fluid, the mother substrate 300 may be transported to the exfoliated layer forming unit 140. In one embodiment, the exfoliated layer forming unit 140 may be used to form a mechanical exfoliated layer on the mother substrate 300.

The exfoliated layer forming unit 140 may include an exfoliated layer spreading unit 141, a second rinsing unit 142, and a second air knife unit 143. The exfoliated layer spreading unit 141 may be used to form a mechanical exfoliated layer on the mother substrate 300 on which the electrolyte treatment was performed. In one embodiment, the exfoliated layer spreading unit 141 may be used to form the mechanical exfoliated layer on the electrolyte treatment fluid in a spray form. The mechanical exfoliated layer may contain at least one of a graphene oxide and montmorillonite (MMT). For example, the mechanical exfoliated layer may be attached to a polyimide layer and the mother substrate 300 via electrostatic attraction. Similar to the first rinsing unit 132, the second rinsing unit 142 may spray the mechanical exfoliated layer with nonpolar water. In one embodiment, the second rinsing unit 142 may partially remove impurities from the mechanical exfoliated layer by rinsing the same. The second rinsing unit 142 may spray the mechanical exfoliated layer with air in the same or substantially the same manner as the first rinsing unit 132. In one embodiment, the second air knife unit 143 may remove moisture from the mechanical exfoliated layer. Also, the second air knife unit 143 may redistribute a portion of the mechanical exfoliated layer which has piled in a certain area, such that the mechanical exfoliated layer is evenly formed on the mother substrate 300. For example, nozzles may be arranged in the second air knife unit 143 and configured to spray the mother substrate 300 to be transported with air. The above-described operation may be performed by transporting the mother substrate 300 via the conveyor 180 installed to pass through the exfoliated layer spreading unit 141, the second rinsing unit 142, and the second air knife unit 143.

The substrate forming unit 161 may form polyimide layers on the mechanical exfoliated layer. In one embodiment, the substrate forming unit 161 may form polyimide layer on the mechanical exfoliated layer via slit nozzles. Also, after forming the polyimide layer, the substrate forming unit 161 may harden the polyimide layer by applying heat, hot air, etc., thereby forming polyimide layers.

Therefore, because it is unnecessary to separately apply energy (for example, laser, heat, etc.) to a substrate and the mother substrate 300 when separating the substrate and the mother substrate 300 from each other in the apparatus 100 for manufacturing a display apparatus, the substrate and the mother substrate 300 may be easily separated from each other.

Also, because substrate and the mother substrate 300 are easily separated from each other in the apparatus 100 for manufacturing a display apparatus, productivity may be increased and manufacturing facilities may be simplified.

Hereinafter, a method of manufacturing a display apparatus will be described in further detail.

Figure 2:
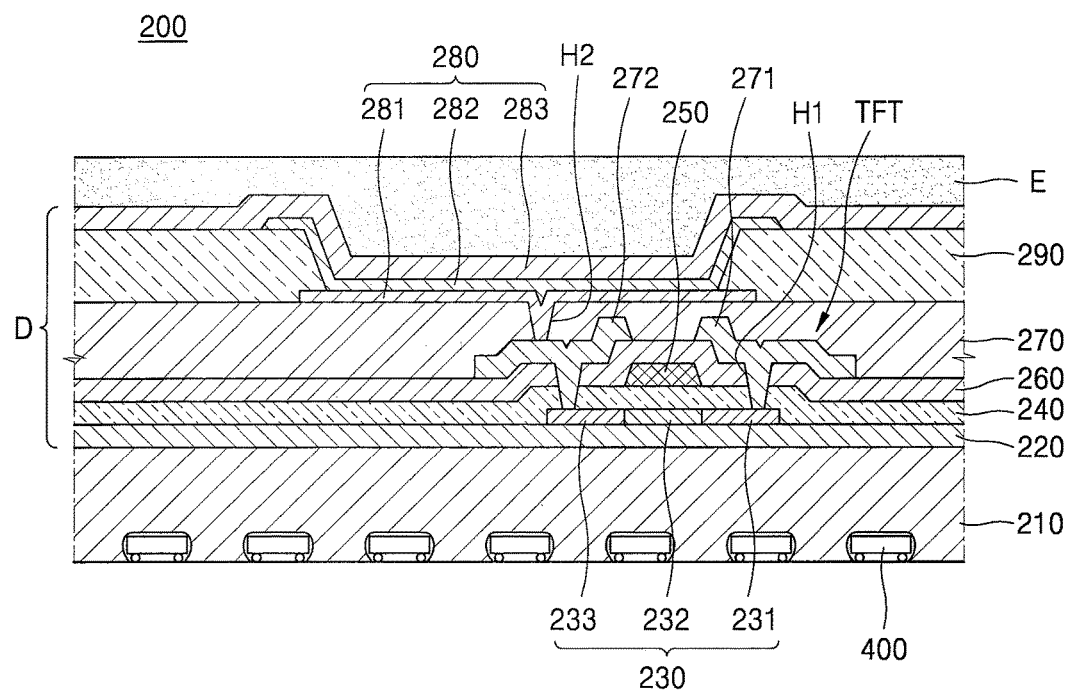
FIG. 2 is a partial cross-sectional view of the display apparatus manufactured by the apparatus for manufacturing the display apparatus shown in FIG. 1.
Figure 3:
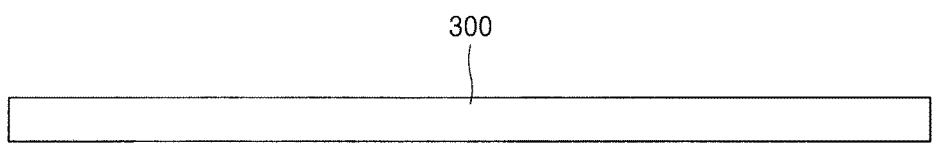
FIGS. 3 to 7 are cross-sectional views that sequentially illustrate a manufacturing procedure of the display apparatus manufactured by the apparatus for manufacturing the display apparatus shown in FIG. 2.
Figure 4:
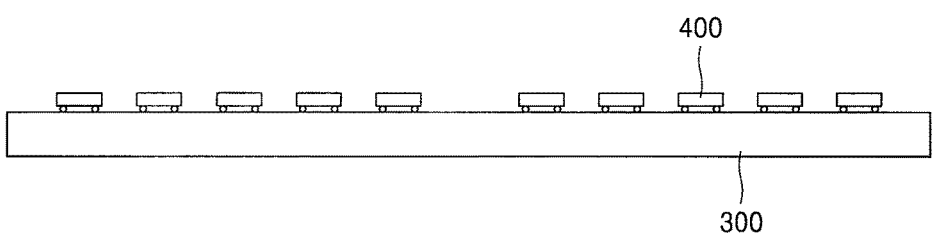
Figure 5:
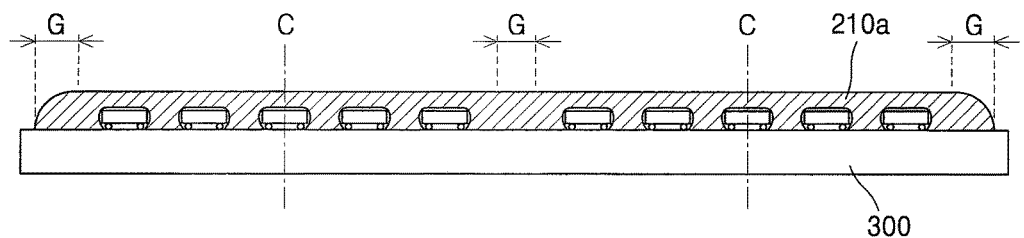
Figure 6:
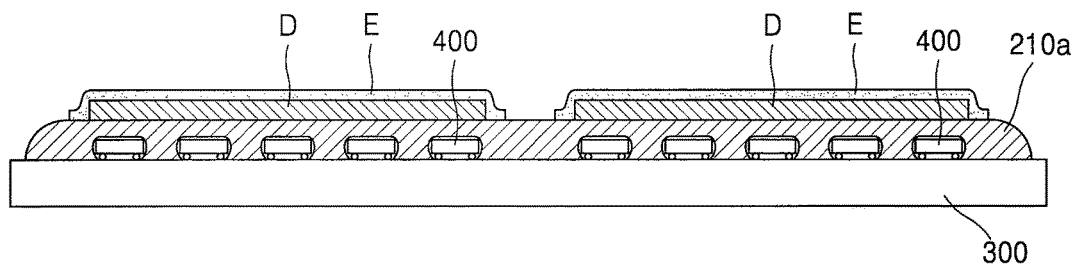
Figure 7:
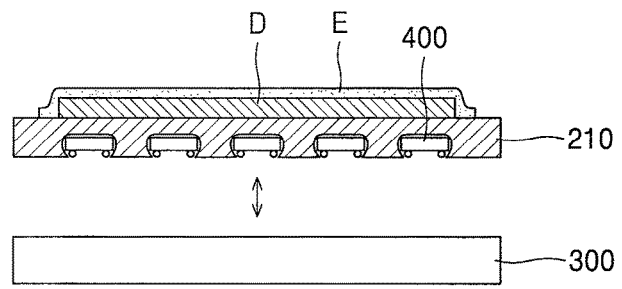

FIG. 2 is a partial cross-sectional view of a display apparatus 200 manufactured by the apparatus 100 for manufacturing a display apparatus shown in FIG. 1, and FIGS. 3 to 7 are cross-sectional views that sequentially illustrate a manufacturing procedure of the display apparatus manufactured by the apparatus for manufacturing a display apparatus shown in FIG. 2.

Referring to FIGS. 2 to 7, the display apparatus 200 may include a substrate 210 and a display D. Also, the display apparatus 200 may include a thin film encapsulation layer E formed on the display D.

The display D may be formed on the substrate 210. In one embodiment, the display D may include a thin film transistor (TFT), a passivation layer 270 formed to cover the TFT, and an organic light-emitting diode (OLED) 280 formed on the passivation layer 270. In one embodiment, the substrate 210 may be formed of polyimide (PI).

The substrates 210 may be formed by spreading polyimide resin on the mother substrate 300. For example, the mother substrate 300 may be transported to the dry cleansing unit 120 from the outside (e.g., from outside the dry cleansing unit 120) via the loading unit 110.

The dry cleansing unit 120 may spray oxygen plasma onto the mother substrate 300. In one embodiment, the oxygen plasma negatively charges a surface of the mother substrate 300 and may remove impurities from the surface of the mother substrate 300.

The mother substrate 300 from which the impurities have been removed may be transported to the electrolyte treatment unit 130. In one embodiment, the electrolyte treatment fluid coating unit 131 coats the mother substrate 300 with the electrolyte treatment fluid and may treat the surface of the mother substrate 300 with electrolyte fluid. Also, the first rinsing unit 132 may rinse the mother substrate 300, which is transported by the conveyor 180, with nonpolar water.

The rinsed mother substrate 300 is transported to the first air knife unit 133, and the first air knife unit 133 may prevent the electrolyte treatment fluid from agglomerating in a certain area of the mother substrate 300 while evaporating the electrolyte treatment fluid on the mother substrate 300.

Once treating the mother substrate 300 with the electrolyte treatment fluid is completed, the mother substrate 300 may be transported to the exfoliated layer forming unit 140 via the conveyor 180. In one embodiment, the exfoliated layer spreading unit 141 may be used to form the mechanical exfoliated layers 400 on the mother substrate 300 treated with the electrolyte treatment fluid. In one embodiment, the exfoliated layer spreading unit 141 may spread the mechanical exfoliated layers 400 on the mother substrate 300 for which the electrolyte treatment is performed. For example, the exfoliated layer spreading unit 141 may spray mechanical exfoliated material on the mother substrate 300 in an aqueous-solution form (e.g., as an aqueous solution) and form the mechanical exfoliated layers therefrom.

Also, the second rinsing unit 142 may spray nonpolar water onto the mother substrate 300 on which the mechanical exfoliated layers 400 are spread and may rinse the mother substrate 300. After the mother substrate 300 has been sprayed with the nonpolar water, the mother substrate 300 is transported and the second air knife unit 143 may spray the mother substrate 300 with air, which may prevent the mechanical exfoliated layers 400 from being piled in a certain area of the mother substrate 300. Also, the second air knife unit 143 removes some of the mechanical exfoliated layers 400 and may evenly spread the mechanical exfoliated layers 400 on the mother substrate 300. In addition, the second air knife unit 143 may partially remove moisture from the mechanical exfoliated layers 400 and thereby attach the mechanical exfoliated layers 400 to the mother substrate 300.

The mother substrate 300 on which the mechanical exfoliated layers 400 are formed may be transported to the outside via the unloading unit 150. In one embodiment, the mother substrate 300 may be transported to the substrate forming unit 161.

The substrate forming unit 161 may be used to form the substrates 210 on the mother substrate 300. For example, polyimide resin is spread across the mother substrate 300 to form polyimide layers 210a. In one embodiment, there may be the plurality of polyimide layers 210a on the mother substrate 300, and the polyimide layers 210a may be separated from each other. Also, the mechanical exfoliated layers 400 may be evenly spread across the mother substrate 300. For example, the mechanical exfoliated layers 400 may be formed spaced from (e.g., spaced apart from) one another on the mother substrate 300 instead of each being spread across an entire surface of the mother substrate 300. Therefore, when polyimide resin is spread across the mother substrate 300, the mechanical exfoliated layers 400 may be disposed inside the polyimide layers 210a, and the polyimide layers 210a may directly contact the mother substrate 300 or may be attached to the mother substrate 300 via the mechanical exfoliated layers 400.

After the polyimide layers 210a are formed, the substrate forming unit 161 may remove moisture from the polyimide layers 210a. In one embodiment, the mechanical exfoliated layers 400 disposed between the polyimide layers 210a and the mother substrate 300 or the mechanical exfoliated layers 400 disposed inside the polyimide layers 210a may be removed from boundary regions G of the polyimide layers 210a. Therefore, the mechanical exfoliated layers 400 do not exist in (e.g., are not present in) the boundary regions G of the polyimide layers 210a, and the polyimide layers 210a may be directly attached to the mother substrate 300. Also, the mechanical exfoliated layers 400 may be evenly spread across a central region of the polyimide layers 210a, except the boundary regions G and regions between the central region and the boundary regions G.

When the polyimide layers 210a are formed on the mother substrate 300 as described above, the polyimide layers 210a may be easily separated from the mother substrate 300. For example, when the substrates 210 are generally manufactured by forming the polyimide layers 210a on the mother substrate 300, the polyimide layers 210a and the mother substrate 300 may be physically connected to each other as some of the polyimide layers 210a are inserted between uneven structures, protrusions, etc. formed on the surface of the mother substrate 300. Because the above-described connection is firm, the polyimide layers 210a and the mother substrate 300 may be separated from one another by forming a transistor, the OLED 280, the thin film encapsulation layer E and then irradiating the same with a laser beam. In this case, it may be necessary to additionally include an inspection device configured to check whether the polyimide layers 210a have been completely separated from the mother substrate 300, a cleansing device for cleaning the mother substrate 300 for reuse, or the like to be used when irradiating the mother substrate 300 with the laser beam.

However, when the polyimide layers 210a are separated from the mother substrate 300 according to one or more embodiments of the inventive concept, the polyimide layers 210a are attached to portions where the mechanical exfoliated layers 400 are formed by electrostatic attraction generated between the mechanical exfoliated layers 400 and the mother substrate 300, and the polyimide layers 210a and the mother substrate 300 are attached to portions where the polyimide layers 2106a directly contact the mother substrate 300 by a physical connection. Therefore, a connection between the exfoliated layers 400 and the mother substrate 300 may be weaker than an existing connection between the polyimide layers 210a and a mother substrate. Therefore, the polyimide layers 210a according to one or more embodiments of the inventive concept may be easily separated from the mother substrate 300 without a laser beam.

As described above, another structure may be formed on the substrates 210 after the polyimide layers 210a are formed on the mother substrate 300 and then after the substrates 210 are formed. In one embodiment, the mother substrate 300 may be transported from the substrate forming unit 161 to the transistor forming unit 162. In the transistor forming unit 162, various TFTs may be formed on the substrates 210.

For example, a buffer layer 220 formed of an organic compound and/or an inorganic compound is further formed on an upper surface of the substrate 210 and may be formed of $SiO_x$ ($x \geq 1$) and $SiN_x$ ($x \geq 1$).

After an active layer 230 that is arranged in a pattern (e.g., a predetermined pattern) is formed on the buffer layer 220, the active layer 230 is buried by (e.g., covered by) a gate insulating layer 240. The active layer 230 may include a source area 231, a drain area 233, and a channel area 232 therebetween.

The active layer 230 may be formed of various materials. For example, the active layer 230 may contain an inorganic semiconductor material, such as amorphous silicon, or crystalline silicon. As another example, the active layer 230 may contain an oxide semiconductor material. As another example, the active layer 230 may contain an organic semiconductor material. Hereinafter, for convenience of explanation, an embodiment in which the active layer 230 is formed of amorphous silicon will be described in further detail.

After an amorphous silicon layer is formed on the buffer layer 220, the amorphous silicon layer is crystallized to form a crystalline silicon layer. The crystalline silicon layer is patterned to form the active layer 230, and accordingly, the active layer 230 is formed. The source area 231 and the drain area 233 of the active layer 230 are doped with impurities in accordance with types of TFTs, such as a driving TFT, a switching TFT, etc.

A gate electrode 250 corresponding to the active layer 230 and an interlayer insulating layer 260 burying (e.g., covering) the gate electrode 250 are formed on the gate insulating layer 240.

A contact opening H1 (e.g., a contact hole) is formed in the interlayer insulating layer 260 and the gate insulating layer 240, and a source electrode 271 and a drain electrode 272 formed on the interlayer insulating layer 260 respectively contacting the source area 231 and the drain area 233.

The passivation layer 270 is formed on the upper surface of the TFT, and a pixel electrode 281 of the OLED 280 is formed on an upper surface of the passivation layer 270. The pixel electrode 281 contacts the drain electrode 272 of the TFT via a via opening H2 (e.g., a via hole) formed in the passivation layer 270. The passivation layer 270 may be formed of an inorganic and/or organic material and may be a single layer or have a multi-layer structure. The passivation layer 270 may be a planarization layer which has a flat upper surface regardless whether the lower surface thereof is even or uneven or an upper surface having uneven portions corresponding to uneven portions of the lower surface thereof. In one embodiment, the passivation layer 270 is formed by using a transparent insulating material in order to accomplish a resonance effect.

After the pixel electrode 281 is formed on the passivation layer 270, a pixel-defining layer 290 is formed of an organic and/or inorganic material in order to cover the pixel electrode 281 and the passivation layer 270, and an opening is formed to expose the pixel electrode 281.

After the pixel electrode 281 is formed, the mother substrate 300 may be transported to the organic light-emitting device forming unit 163. For example, an intermediate layer 282 and an opposite electrode 283 may be formed by the organic light-emitting device forming unit 163.

For example, the intermediate layer 282 and the opposite electrode 283 are formed at least on the pixel electrode 281.

In one embodiment, the pixel electrode 281 functions as an anode, and the opposite electrode 283 functions as a cathode. However, the polarities of the pixel electrode 281 and the opposite electrode 283 may be reversed.

The pixel electrode 281 and the opposite electrode 283 are insulated from each other by the intermediate layer 282, and an organic emission layer emits light based on voltages which have different polarities and are applied to the intermediate layer 282.

The intermediate layer 282 may include an organic emission layer. As an example, the intermediate layer 282 includes an organic emission layer and may further include one or more of a hole injection layer (HIL), a hole transport layer (HTL), an electron transport layer (ETL), and an electron injection layer (EIL).

A unit pixel P includes a plurality of sub pixels R, G, and B, and the sub pixels R, G, and B may emit various colors of light. For example, the unit pixel P may include the sub pixels R, G, and B that respectively emit red light, green light, and blue light or sub pixels that respectively emit red light, green light, blue light, and white light.

After the above operations are completed, the thin film encapsulation layer E may be formed on the display D. For example, after forming the display D on the mother substrate 300, the mother substrate 300 is transported to the encapsulation layer forming unit 164, the encapsulation layer forming unit 164 is used to form the thin film encapsulation layer E on the display D, and thus, the display D may be shielded from the outside.

In one embodiment, the thin film encapsulation layer E may include a plurality of inorganic layers or include both an inorganic layer and an organic layer.

An organic layer formed on the thin film encapsulation layer E is formed of a polymer and may be a single layer or a multi-layer stack formed of polyethylene terephthalate, polyimide, polycarbonate, epoxy, polyethylene, and polyacrylate. Alternatively, the organic layer may be formed of polyacrylate, and for example, the organic layer may include a polymerized monomer composition including a diacrylate-based monomer and a triacrylate-based monomer. The monomer composition may further include a monoacrylate-based monomer. Also, the monomer composition may further include a well-known photoinitiator, such as TPO, but is not limited thereto.

An inorganic layer formed on the thin film encapsulation layer E may be a single layer or multi-layer stack including a metal oxide or metal nitride. For example, the inorganic layer may include $SiN_x$, aluminum oxide ($Al_2O_3$), $SiO_2$, and/or tin oxide ($TiO_2$).

An uppermost layer of the thin film encapsulation layer E which is exposed to the outside may be an inorganic layer in order to prevent moisture from penetrating the OLED 280.

The thin film encapsulation layer E may have at least one sandwich structure in which at least one organic layer is disposed between at least two inorganic layers. As another example, the thin film encapsulation layer E may have at least one sandwich structure in which at least one inorganic layer is disposed between at least two organic layers. As another example, the thin film encapsulation layer E may have at least one sandwich structure in which at least one organic layer is disposed between at least two inorganic layers and/or at least one sandwich structure in which at least one inorganic layer is disposed between at least two organic layers.

The thin film encapsulation layer E may sequentially include a first inorganic layer, a first organic layer, and a second inorganic layer from an upper surface of the OLED 280.

As another example, the thin film encapsulation layer E may sequentially include a first inorganic layer, a first organic layer, a second inorganic layer, a second organic layer, and a third inorganic layer from the upper surface of the OLED 280.

As another example, the thin film encapsulation layer E may sequentially include a first inorganic layer, a first organic layer, a second inorganic layer, a second organic layer, a third inorganic layer, a third organic layer, and a fourth inorganic layer from the upper surface of the OLED 280.

A halogenated metal layer including lithium fluoride (LiF) may be further included between the OLED 280 and the first inorganic layer. The halogenated metal layer may prevent the OLED from being damaged when the first inorganic layer is formed by sputtering.

An area of the first organic layer may be smaller than that of the second inorganic layer, and an area of the second organic layer may be smaller than that of the third inorganic layer.

The mother substrate 300 on which the thin film encapsulation layer E is formed may be transported to the cutting unit 170. In one embodiment, the cutting unit 170 cuts the substrates 210 formed to be separated from each other such that the display apparatus 200 may be divided into a plurality of smaller display apparatuses. For example, the cutting unit 170 may cut the mother substrate 300 along the boundary regions G of the substrates 210. In one embodiment, the mechanical exfoliated layers 400 do not exist around the boundary regions G of the substrates 210, and because tension is applied to central portions of the substrates 210 formed of polyimide, the substrates 210 may be easily separated from the mother substrate 300 when the boundary regions G of the substrates 210 are cut. For example, the polyimide layers 210a at the boundary regions G of the substrates 210 are directly connected to the mother substrate 300, and thus, each of the substrates 210 may receive energy or power, and the central portions C of the substrates 210 connected to the mother substrate 300 may receive less energy or power from the mother substrate 300 than the boundary regions G of the substrates 210 to the mother substrate 300. Thus, when the boundary regions G of the substrates 210 are cut, the substrates 210 may be easily separated from the mother substrate 300. Also, when the substrates 210 are easily separated from the mother substrate 300, a mechanical separation layer prevents static from being generated when the substrates 210 are separated from the mother substrate 300, and thus, devices disposed on the substrates 210 may be protected from static discharge.

As a result, according to the method of manufacturing a display apparatus, the display apparatus 200 may be easily and quickly manufactured, and damage to the devices disposed on the substrates 210 caused by the static, which is generated when the display apparatus 200 is manufactured, may be reduced or minimized.

Also, because the display apparatus 200 may be separated from the mother substrate 300 without using a laser beam, the devices may be prevented from being damaged by the laser beam, and a failure rate may be reduced or minimized.

As described above, according to the one or more of the above-described exemplary embodiments, a display apparatus may be easily manufactured.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. An apparatus for manufacturing a display apparatus, the apparatus comprising:
    a loading unit configured to receive a mother substrate;
    a dry cleansing unit connected to the loading unit and configured to remove impurities from a surface of the mother substrate;
    an electrolyte treatment unit connected to the dry cleansing unit and configured to treat the surface of the mother substrate having the impurities removed therefrom with an electrolyte treatment fluid and drying the electrolyte treatment fluid on the surface of the mother substrate;
    an exfoliated layer forming unit connected to the electrolyte treatment unit and configured to form an exfoliated layer on the surface of the mother substrate treated with the electrolyte treatment fluid by spreading the exfoliated layer on the surface of the mother substrate and drying the exfoliated layer on the surface of the mother substrate;
    a substrate forming unit connected to the exfoliated layer forming unit and configured to form a substrate on the mother substrate by forming a polyimide layer on the exfoliated layer of the mother substrate;
    an organic light-emitting device forming unit connected to the substrate forming unit and configured to form an organic light-emitting display on a surface of the substrate opposite to a surface of the substrate facing the mother substrate; and
    a cutting unit connected to the organic light-emitting device forming unit and configured to separate the substrate having the organic light-emitting display thereon from the mother substrate at the exfoliated layer, the exfoliated layer reducing a bonding strength between the substrate and the mother substrate.

2. The apparatus of claim 1, wherein the dry cleansing unit is configured to spray oxygen plasma onto the mother substrate.

3. The apparatus of claim 1, wherein the electrolyte treatment unit comprises:
    an electrolyte treatment fluid coating unit configured to coat the surface of the mother substrate with the electrolyte treatment fluid; and a first rinsing unit configured to spray the mother substrate with nonpolar water to rinse the mother substrate.

4. The apparatus of claim 3, wherein the electrolyte treatment unit further comprises a first air knife unit configured to evaporate the electrolyte treatment fluid on the mother substrate and to remove a portion of the electrolyte treatment fluid.

5. The apparatus of claim 3, wherein the electrolyte treatment fluid contains poly diallyldimethylammonium chloride (PDDA).

6. The apparatus of claim 1, wherein the exfoliated layer forming unit comprises:
an exfoliated layer spreading unit configured to spread the exfoliated layer onto the surface of the mother substrate treated with the electrolyte treatment fluid; and
a second rinsing unit configured to spray the exfoliated layer with nonpolar water to rinse the exfoliated layer.

7. The apparatus of claim 6, wherein the exfoliated layer forming unit further comprises a second air knife unit configured to remove moisture from the exfoliated layer and to remove a portion of the exfoliated layer.

8. The apparatus of claim 6, wherein the exfoliated layer contains at least one of a graphene oxide and montmorillonite (MMT).

9. The apparatus of claim 1, wherein the exfoliated layer is formed on at least a portion of the mother substrate.

10. The apparatus of claim 1, further comprising an encapsulation layer forming unit connected between the organic light-emitting device forming unit and the cutting unit and configured to form a thin film encapsulation layer on the organic light-emitting display on the surface of the substrate.

11. A method of manufacturing a display apparatus, the method comprising:
providing a mother substrate;
removing impurities from a surface of the mother substrate;
treating the surface of a mother substrate having the impurities removed therefrom with an electrolyte treatment fluid and drying the electrolyte treatment fluid on the surface of the mother substrate;
forming an exfoliated layer on the surface of the mother substrate treated with the electrolyte treatment fluid by spreading the exfoliated layer on the mother substrate and drying the exfoliated layer on the surface of the mother substrate;
forming a substrate on the surface of the mother substrate by forming a polyimide layer on the exfoliated layer of the mother substrate;
forming a display on a surface the substrate opposite to a surface of the substrate facing the mother substrate; and
separating the substrate having the display thereon from the mother substrate at the exfoliated layer, the exfoliated layer reducing a bonding strength between the substrate and the mother substrate.

12. The method of claim 11, wherein the removing of the impurities from the surface of the mother substrate comprises spraying oxygen plasma onto the surface of the mother substrate.

13. The method of claim 11, wherein the treating the surface of the mother substrate comprises:
treating the surface of the mother substrate with the electrolyte treatment fluid; and
spraying the electrolyte treatment fluid with nonpolar water to rinse the mother substrate.

14. The method of claim 13, wherein the drying the electrolyte treatment fluid comprises spraying the electrolyte treatment fluid with air and removing a portion of the electrolyte treatment fluid.

15. The method of claim 11, wherein the electrolyte treatment fluid contains poly diallyldimethylammonium chloride (PDDA).

16. The method of claim 11, wherein the forming of the exfoliated layer comprises
spraying the exfoliated layer with nonpolar water to rinse the exfoliated layer.

17. The method of claim 16, wherein the
drying the exfoliated layer comprises spraying the exfoliated layer with air and removing a portion of the exfoliated layer.

18. The method of claim 11, wherein the exfoliated layer contains at least one of a graphene oxide and montmorillonite (MMT).

19. A method of manufacturing a display apparatus, the method comprising:
providing a mother substrate;
removing impurities from a surface of the mother substrate;
treating the surface of a mother substrate having the impurities removed therefrom with an electrolyte treatment fluid and drying the electrolyte treatment fluid on the surface of the mother substrate, the electrolyte treatment fluid containing poly diallyldimethylammonium chloride (PDDA);
forming an exfoliated layer on the surface of the mother substrate treated with the electrolyte treatment fluid by spreading the exfoliated layer on the mother substrate and drying the exfoliated layer on the surface of the mother substrate, the exfoliated layer containing at least one of a graphene oxide and montmorillonite (MMT);
forming a substrate on the surface of the mother substrate by forming a polyimide layer on the exfoliated layer of the mother substrate;
forming a display on a surface the substrate opposite to a surface of the substrate facing the mother substrate; and
separating the substrate having the display thereon from the mother substrate at the exfoliated layer, the exfoliated layer reducing a bonding strength between the substrate and the mother substrate.

* * * * *